United States Patent
Shen et al.

(10) Patent No.: US 11,127,447 B2
(45) Date of Patent: Sep. 21, 2021

(54) VOLTAGE-CONTROLLED MAGNETIC ANISOTROPIC MAGNETIC RANDOM ACCESS MEMORY AND STORAGE STATE DETERMINING METHOD THEREFOR

(71) Applicant: SHANGHAI IC R&D CENTER CO., LTD., Shanghai (CN)

(72) Inventors: Ling Shen, Shanghai (CN); Yu Jiang, Shanghai (CN); Huijie Yan, Shanghai (CN); Jianxin Wen, Shanghai (CN)

(73) Assignee: SHANGHAI IC R&D CENTER CO., LTD, Shanghai (CN)

( * ) Notice: Subject to any disclaimer, the term of this patent is extended or adjusted under 35 U.S.C. 154(b) by 0 days.

(21) Appl. No.: 16/753,339

(22) PCT Filed: Oct. 25, 2018

(86) PCT No.: PCT/CN2018/102889
§ 371 (c)(1),
(2) Date: Apr. 3, 2020

(87) PCT Pub. No.: WO2019/085617
PCT Pub. Date: May 9, 2019

(65) Prior Publication Data
US 2020/0258560 A1    Aug. 13, 2020

(30) Foreign Application Priority Data
Oct. 30, 2017   (CN) .......................... 201711051925.9

(51) Int. Cl.
*G11C 11/16*    (2006.01)

(52) U.S. Cl.
CPC ...... *G11C 11/1673* (2013.01); *G11C 11/1659* (2013.01)

(58) Field of Classification Search
CPC .................................................. G11C 11/1673
See application file for complete search history.

(56) References Cited

U.S. PATENT DOCUMENTS

| | | |
|---|---|---|
| 2015/0036421 A1 * | 2/2015 | Kim .......................... G11C 7/14 365/158 |
| 2016/0276000 A1 * | 9/2016 | Khayatzadeh ....... G11C 29/026 |

* cited by examiner

*Primary Examiner* — Douglas King
(74) *Attorney, Agent, or Firm* — Tianchen LLC.; Yuan R. Li; Yi Fan Yin

(57) ABSTRACT

The disclosure provides a voltage-controlled magnetic anisotropic magnetic random access memory. The memory comprises a virtual array, a memory array and a peripheral circuit, wherein the memory array comprises memory cells with X rows and Y columns; the virtual array comprises virtual cells with X rows and one column; the peripheral circuit comprises at least one data sampling-decision-output circuit, the data sampling-decision-output circuit comprises a sensitive amplifier circuit and a logic circuit in series, and are simultaneously connected to the data sampling-decision-output circuit in the peripheral circuit at the same time. By changing the width-length ratio of a differential circuit in the sensitive amplifier circuit and adding the virtual array, the problem that the storage state of the voltage-controlled magnetic anisotropy magnetic random access memory cannot be determined is effectively solved, and the risk of resistance deviation under different process conditions also can be avoided.

10 Claims, 4 Drawing Sheets

---the prior art---

---the prior art---

---the prior art---

VOLTAGE-CONTROLLED MAGNETIC ANISOTROPIC MAGNETIC RANDOM ACCESS MEMORY AND STORAGE STATE DETERMINING METHOD THEREFOR

CROSS-REFERENCE TO RELATED APPLICATION

This application claims priority of International Patent Application Serial No. PCT/CN2018/102889, filed Oct. 25, 2018, which is related to and claims priority of Chinese patent application Serial No. 201711051925.9, filed Oct. 30, 2017. The entirety of each of the above-mentioned patent applications is hereby incorporated herein by reference and made a part of this specification.

TECHNICAL FIELD

The disclosure relates to a semiconductor integrated circuit, in particular to a voltage controlled magnetic anisotropic magnetic random access memory and a storage state determining method thereof.

BACKGROUND

Magnetic Random Access Memory (MRAM) is a non-volatile Memory that utilizes electromagnetic characteristics to store data. The primary storage structure of the MRAM is referred to as a Magnetic Tunnel Junction MTJ. As shown in FIG. 1, the magnetization direction of the reference layer is fixed and the magnetization direction of the electrons of the free layer can be changed through the change of the external electromagnetic conditions, so that two kinds of permanently stored charge spin directions can be formed. In terms of electrical characteristics, it is equivalent to two different resistance values, which can be expressed by Rp and Rap respectively.

The MTJ adopted by the mainstream MeRAM is now using its Spin Transfer Torque (STT) characteristics to perform an erase operation. In the MeRAM array, the programming of the MTJ is mainly accomplished by the polarity of the voltage applied across the positive and negative electrodes of the MTJ. As shown in FIG. 2, when a positive voltage is applied, the resistance of the MTJ may be reduced, and when a negative voltage is applied, the resistance of the MTJ may be increased. When reading the stored data, the resistance difference is converted into the voltage difference or the current difference by using the characteristics of different resistance values of the MTJs in different states. By reasonably designing the resistance value of the reference resistance (Refres), the difference value between the resistance values of the reference resistance and the MTJ is converted into a voltage signal difference or a current signal difference through the reading circuit, and then the corresponding stored value is obtained through comparison by the sensitive amplifier. At present, the MeRAM technology based on the STTMTJ is relatively mature, and the corresponding control circuit technology is also comparatively perfect.

At present, there is a novel MeRAM technology adopts the MTJ with VCMA (Voltage-Controlled Magnetic Anisotropy) effect. The main difference from the STT is that it uses the pulse of the MTJ voltage rather than the polarity to change the resistance characteristics of the MTJ, as shown in FIG. 3. Specifically, after a voltage pulse of a certain length being loaded on the MTJ, the resistance characteristic of the MTJ will change, i.e., the original high resistance becomes a low resistance, while the original low resistance becomes a high resistance. The advantage of the VCMA is that the programming time can be effectively reduced and the operating speed of the memory can be increased. Since the programming mode is different, the design of the peripheral control circuit is different.

Under the existing conditions, the VCMA MeRAM has many design difficulties. The first design difficulty is that the MTJ has a difference between the resistance values of the same state, and the peripheral circuit needs to have some margin to determine the same MTJ state; the second design difficulty is that, compared with the MTJ of the STT, the distinguishing degree between the high and low resistance values of the MTJ programmed based on the VCMA characteristic is smaller, and higher precision requirements are required for the peripheral control circuit; and the third design difficulty is that the storage state of the MTJ cannot be controlled and learned. When fabricated, the MTJ device is randomly in a high resistance state or a low resistance state. In the STT MeRAM, since the configuration of the MTJ erase operation is different, the desired state can be obtained by late operation; however, the VCMA mode cannot determine the state of any one MTJ by circuit configuration due to the same erase and write mode and time during programming. In addition, the MTJ may generate a resistance deviation in the same state due to process reasons, which may result in a read error if the accuracy of the resistance value of the peripheral circuit is too high. Therefore, the conventional STT MeRAM programming mode is not suitable for the VCMA MERAM, and a new scheme is needed for read-write control.

SUMMARY

The technical problem to be solved by the disclosure is to provide a voltage-controlled magnetic anisotropic magnetic random access memory and a storage state determining method thereof. By adding a virtual array and adjusting the ratio of corresponding differencial transistors' width/length ratio in the sensitive amplifier circuit, the problem that the storage state of the voltage-controlled magnetic anisotropic magnetic random memory cannot be determined is solved effectively, and also the resistance offset risk existing under different process conditions is avoided.

To achieve the above objects, the present disclosure provides a voltage-controlled magnetic anisotropic magnetic random access memory, which comprises a virtual array, a memory array and a peripheral circuit; the memory array comprises memory cells with X rows and Y columns; the virtual arrays comprises virtual cells with X rows and one column; wherein each virtual cell in the virtual array corresponds to the same row of the memory cells in the memory array; the peripheral circuit comprises at least one data sampling-decision-output circuit, the virtual array and the memory array are simultaneously connected to the data sampling-decision-output circuit of the peripheral circuit; wherein both X and Y are integers greater than or equal to 1.

Further, the data sampling-decision-output circuit comprises a first input port, a second input port, a control signal port and an output port; wherein the first input port is connected to the virtual array, the second input port is connected to the memory array, the data sampling-decision-output circuit comprises a sensitive amplifier circuit and a logic circuit which are connected in series, the sensitive amplifier circuit comprises a first sensitive amplifier and a second sensitive amplifier with the same structure in parallel, and each of the first sensitive amplifier and the second sensitive amplifier comprises an N-way input port, a P-way input port, an N-way output port and a P-way output port; the first input port is connected to the N-way input port of the first sensitive amplifier and the P-way input port of the second sensitive amplifier, the second input port is connected to the P-way input port of the first sensitive amplifier and the N-way input port of the second sensitive amplifier, or, the first input port is connected to the P-way input port of the first sensitive amplifier and the N-way input port of the second sensitive amplifier, and the second input port is connected to the N-way input port of the first sensitive amplifier and the P-way input port of the second sensitive amplifier; the N-way output port and the P-way output port in the first sensitive amplifier and the second sensitive amplifier are connected to one end of the logic circuit, and the other end of the logic circuit is connected to the output port.

Further, the first input port and the second input port in the data sampling-decision-output circuit are interchangeable.

Further, each column of memory cells in the memory array is connected to the second input port of one data sampling-decision-output circuit, or a data selector circuit, wherein one end of the data selector circuit is connected to at least one column of the memory cells, the other end is connected to the second input port in the data sampling-decision-output circuit, and the second input port of one data sampling-decision-output circuit can only selectively connect to one column of the memory cells in the memory array or the data selector circuit.

Further, the number of the data selector circuits is A and the total number of columns of memory cells in the memory array connected by the data selector circuit is B, the number of the data sampling-decision-output circuit in the peripheral circuit is (Y−B)+A, wherein, A or B is an integer greater than or equal to 0, and B is less than or equal to Y.

Further, each of the first sensitive amplifier and the second sensitive amplifier as a differential input structure.

Further, in the first sensitive amplifier and second sensitive amplifier, gate electrodes of a first P-type field effect transistor and a second P-type field effect transistor are connected to the control signal port, source electrodes are connected to a power source, and drain electrodes are connected to the N-way output port and the P-way output port respectively; a gate electrode of a third P-type field-effect transistor is connected to the P-way output port, a source electrode is connected to the power source, a drain electrode is connected to N-way output port; a gate electrode of a fourth P-type field-effect transistor is connected to the N-way output port, a source electrode is connected to the power source and a drain electrode is connected to the P-way output port; a gate electrode of a fifth P-type field-effect transistor is connected to the power source, a source electrode is connected to the power source and a drain electrode is connected to the P-way output port; and a gate electrode of a first N-type field-effect transistor is connected to the P-way output port, a drain electrode is connected to the N-way output port, and a source electrode is connected to a drain electrode of a fourth N-type field effect transistor; a gate electrode of a second N-type field-effect transistor is connected to the N-way output port, a drain electrode is connected to the P-way output port, and a source electrode is connected to a drain electrode of a fifth N-type field-effect transistor; a gate electrode of a sixth P-type field effect transistor is connected to the control signal port, and a source electrode and a drain electrode are respectively connected to source electrodes of the first N-type field effect transistor and a second N-type field effect transistor; a gate electrode of the seventh P-type field effect transistor is connected to the control signal port, and a source electrode and a drain electrode are connected to the N-way input port and a gate electrode of a fourth N-type field effect transistor respectively; a gate electrode of an eighth P-type field effect transistor is connected to the control signal port, and a source electrode and a drain electrode are connected to the P-way input port and a gate electrode of a fifth N-type field-effect transistor respectively; and the fourth N-type field effect transistor and a fifth N-type field effect transistor are configured as signal input pairs; a gate electrode of the fourth N-type field effect transistor is connected to the N-way input port through the seventh P-type field effect transistor, a drain electrode is connected to the source electrode of the first N-type field effect transistor, a source electrode is grounded through a sixth N-type field effect transistor; a gate electrode of the fifth N-type field effect transistor is connected to the P-way input port through the eighth P-type field effect transistor, a drain electrode is connected to a source electrode of the second N-type field effect transistor, and a source electrode is grounded through the sixth N-type field effect transistor; a gate electrode of the sixth N-type field effect transistor is connected to the control signal port, a drain electrode is connected to the source electrodes of the fourth N-type field effect transistor and the fifth N-type field effect transistor, and a source electrode is grounded.

Further, the size of the third P-type field effect transistor is larger than that of the fourth P-type field effect transistor, the size of the second N-type field effect transistor is larger than that of the first N-type field effect transistor, the size of the fifth P-type field effect transistor is the difference size value between the third P-type field effect transistor and the fourth P-type field effect transistor, and the size of the third N-type field effect transistor is the difference size value between the second N-type field effect transistor and the first N-type field effect transistor.

In order to solve the problem, the present disclosure also provides a storage state determining method for the voltage controlled magnetic anisotropic magnetic random access memory, comprises: inputting level signals generated by a selected memory cell in the memory array and the virtual cell located in the same row of the selected memory cell into the data sampling-decision-output circuit in the peripheral circuit, and generating an output signal after a logic determination made by the data sampling-decision-output circuit, and then taking the output signal generated as a stored value of the memory cell.

In order to solve the problem, the present disclosure also provides a storage state determining method for the voltage controlled magnetic anisotropic magnetic random access memory, comprises: inputting a level signal generated by a selected memory cell in the memory array into the second input port of a corresponding data sampling-decision-output circuit, inputting a level signal generated by the virtual cell located in the same row of the selected memory cell into the first input port in the data sampling-decision-output circuit, and inputting a control signal into the control signal port; inputting the level signal generated by the virtual cell and the level signal generated by the memory cell cross into the N-way input port and the P-way input port of the first sensitive amplifier and the N-way input port and the P-way input port of the second sensitive amplifier; making the four output values output by the corresponding N-way output port and the P-way output port logically operated in the logic circuit, and taking the output value, which is the logic operation result, of the output port as the storage state of the selected memory cell.

Further, the difference value between the level signals generated by the virtual cell and the memory cell which are in different resistance states is higher than the threshold value of the first sensitive amplifier and the second sensitive amplifier, and the difference value between the level signals generated by the virtual cell and the memory cell which are in the same resistance state is lower than the threshold value of the first sensitive amplifier and the second sensitive amplifier. Wherein, a first signal is input to the N-way input port of the first sensitive amplifier and the P-way input port of the second sensitive amplifier; a second signal is input to the P-way input port of the first sensitive amplifier and the N-way input port of the second sensitive amplifier, and when the values output by the two P-way output ports of the first sensitive amplifier and the second sensitive amplifier are the same and the values output by the two N-way output ports are the same, the maximum difference between the first signal and the second signal is the threshold value of the first sensitive amplifier and the second sensitive amplifier.

Further, if the output value of the output port in the data sampling-decision-output circuit is 0, it is determined that the selected memory cell and the virtual cell are in the same resistance state, and if the output value of the output port in the data sampling-decision-output circuit is 1, then it is determined that the selected memory cell and the virtual cell are in different resistance states; or if the output value of the output port in the data sampling-decision-output circuit is 1, it is determined that the selected memory cell and the virtual cell are in the same resistance state, and if the output value of the output port in the data sampling-decision-output circuit is 0, then it is determined that the selected memory cell and the virtual cell are in different resistance states.

The beneficial effect of the disclosure is that the problem that the initial storage state of the memory cell in the memory array cannot be determined can be effectively solved by adding an additional virtual array. Whether the virtual cell of the virtual array or the memory cell in the memory array, its final output value is based on the results of the two comparisons. The initial value of the memory cell can be directly obtained through the data sampling-decision-output circuit, and the problem that the initial value of the memory cell cannot be determined is effectively solved. Furthermore, no additional reference resistance needs to be introduced during the comparison, and the risk of resistance offset that may be present under different process conditions is also avoided. As long as a reasonable transistor's width/length ratio being designed, the reliability of the sensitive amplifier can be significantly improved on the premise of ensuring normal operation of the sensitive amplifier.

DETAILED DESCRIPTION

Figure 1:
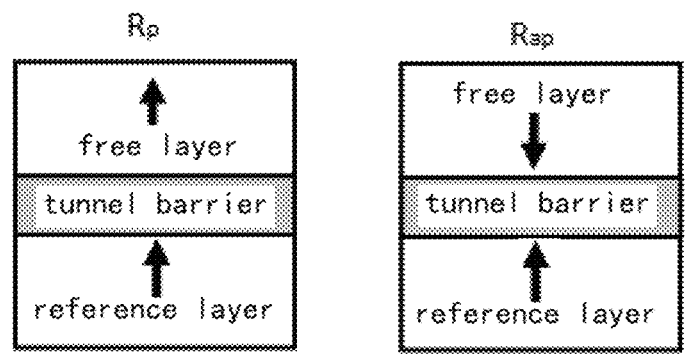
FIG. 1 is a schematic diagram of a magnetic tunnel junction and two states of charge spins in the prior art.
Figure 2:
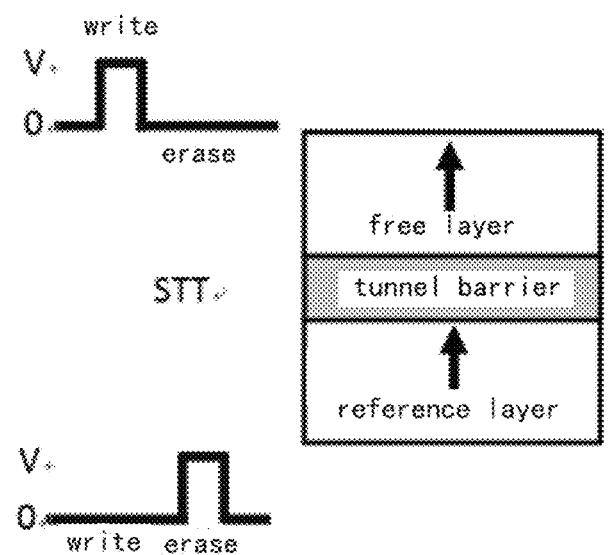
FIG. 2 is a schematic diagram showing a programming method of an STT-magnetic tunnel junction in the prior art.
Figure 3:
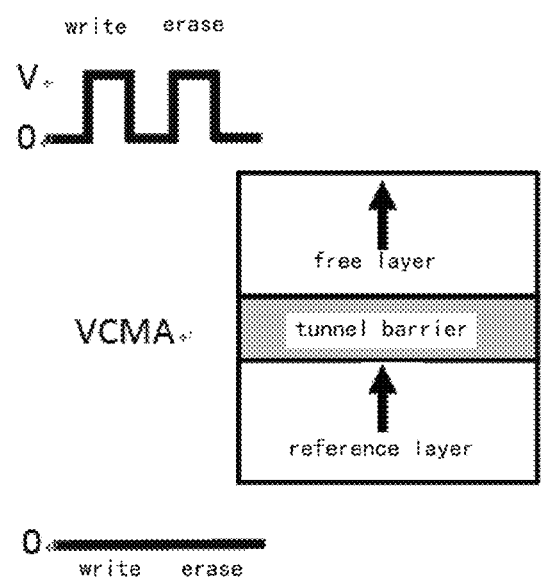
FIG. 3 is a schematic diagram showing a programming method of a VCMA magnetic tunnel junction in the prior art.
Figure 4:
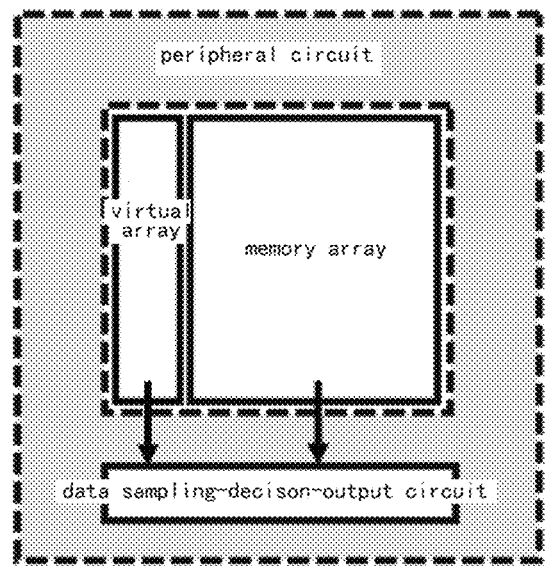
FIG. 4 is a schematic structural diagram of a voltage controlled magnetic anisotropic magnetic random access memory according to an embodiment of the present disclosure.
Figure 5:
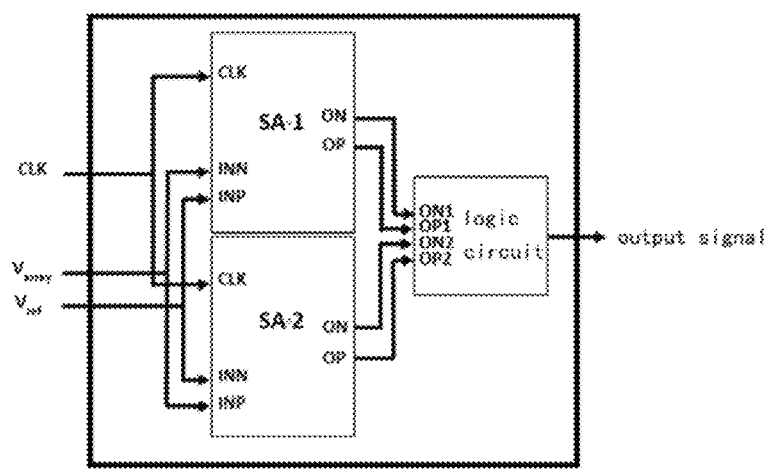
FIG. 5 is a data sampling-decision-output circuit diagram of the peripheral circuit according to an embodiment of the present disclosure.

In order that the objectives, technical solutions, and advantages of the present disclosure will become more apparent, a more particular description of the disclosure will be rendered by reference to specific embodiments thereof which are illustrated in the appended drawings As shown in FIG. 4 and FIG. 5, the disclosure provides a voltage controlled magnetic anisotropic magnetic random access memory which comprises a virtual array, a memory array and a peripheral circuit. The memory array comprises memory cells with X rows and Y columns; the virtual array comprises virtual cells with X-rows and one column, wherein each of the virtual cells in the virtual array corresponds to the same row of memory cells in the memory array, the peripheral circuit comprises at least one data sampling-decision-output circuit, the data sampling-decision-output circuit comprises an first input port and a second input port, a control signal port and an output port; wherein the first input port is connected to the virtual array, and the second input port is connected to the memory array; the data sampling-decision-output circuit comprises a sensitive amplifier circuit and a logic circuit in series, the sensitive amplifier circuit comprises a first sensitive amplifier and a second sensitive amplifier having the same circuit structure connected in parallel, each of the first sensitive amplifier and the second sensitive amplifier comprises an N-way input port, a P-way input port, an N-way output port and a P-way output port. The first input port is connected to the N-way input port of the first sensitive amplifier and the P-way input port of the second sensitive amplifier, the second input port is connected to the P-way input port of the first sensitive amplifier and the N-way input port of the second sensitive amplifier, or, the first input port is connected to the P-way input port of the first sensitive amplifier and the N-way input port of the second sensitive amplifier; the second input port is connected to the N-way input port of the first sensitive amplifier and the P-way input port of the second sensitive amplifier. The N-way output ports and the P-way output ports in the first sensitive amplifier and the second sensitive amplifier are connected to the logic circuit, the other end of the logic circuit is connected to the output port, and both X and Y are integers greater than or equal to 1.

Wherein, the number of data sampling-decision-output circuits in the disclosure is at least one, and at most Y, the number of data sampling-decision-output circuits in FIG. 4 is one, at this time the Y column memory cells are commonly connected to the data selector circuit, and the first end of the data selector circuit is connected to the second input port of the data sampling-decision-output circuit, and only one column of memory arrays is selected to enter the sample-decision-output circuit through the data selector circuit when the voltage controlled magnetically anisotropic magnetic random memory is operating. Similarly, in the present disclosure, when the number of data sampling-decision-output circuits is Y, the memory cells of each column are connected to the second input port of one of the data sampling-decision-output circuit, and similarly, the Y data sampling-decision-output circuits are processed in the same way. Thus, each column of memory cells in the memory array of the present disclosure is connected to the second input port in one data sampling-decision-output circuit, or one data selector circuit, wherein one end of the data selector circuit is connected to at least one column of memory cells, the other end is connected to the second input port in the data sampling-decision-output circuit, and the second input port of the one data sampling-decision-output circuit can only selectively connect to a column of memory cells in the memory array or a data selector circuit. if the number of data selector circuits is A, and the total number of columns of memory cells in the memory array connected by the A data selector circuits is B, the number of data sampling-decision-output circuits in the peripheral circuit is (Y−B)+A, wherein A and B are integers greater than or equal to 0, and B is less than or equal to Y.

Figure 6:
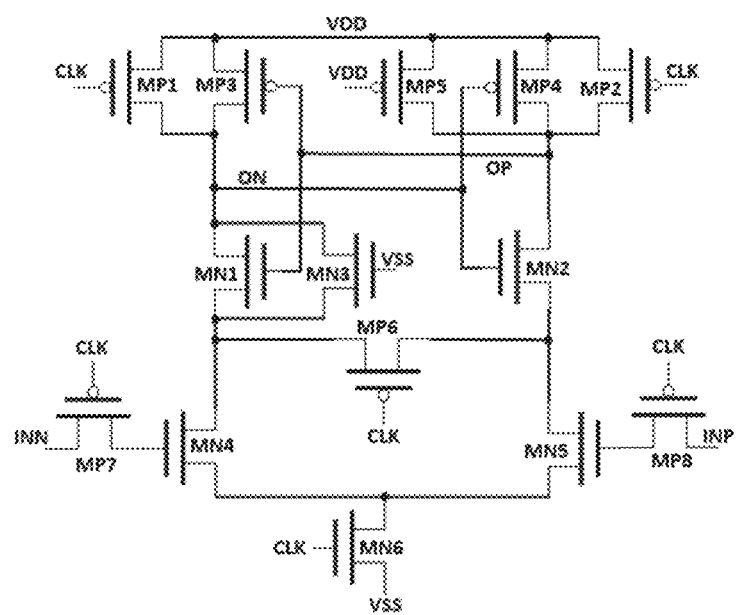
FIG. 6 is a circuit diagram of a sensitive amplifier according to an embodiment of the present disclosure.

The peripheral circuit comprises a first sensitive amplifier and a second sensitive amplifier which both have a differential input structure. The sensitive amplifier circuit with the differential input structure is shown in FIG. 6, which comprises a first P-type field effect transistor MP 1, a second P-type field effect transistor MP 2, a third P-type field effect transistor MP 3, a fourth P-type field effect transistor MP 4, a fifth P-type field effect transistor MP 5, a sixth P-type field effect transistor MP 6, a seventh P-type field effect transistor MP 7, an eighth P-type field effect transistor MP 8, a first N-type field effect transistor MN 1, a second N-type field effect transistor MN 2, a third N-type field effect transistor MN 3, a fourth N-type field effect transistor MN 4, a fifth N-type field effect transistor MN 5 and a sixth N-type field effect transistor MN 6, which are respectively connected to form two paths having a differential input structure. Specifically, the gate electrode of the MP 1 and the MP 2 in the sensitive amplifier circuit are connected to the control signal port, the source electrode is connected to the power source, and the drain electrode of the MP1 is connected to the N-way output port and the drain electrode of the MP2 is connected to the P-way output port respectively; the gate electrode of the MP3 is connected to the P-way output port, the source electrode is connected to the power source and the drain electrode is connected to the N-way output port; the gate electrode of the MP4 is connected to the N-way output port, the source electrode is connected to the power source, the drain electrode is connected to the P-way output port, the gate electrode of the MP5 is connected to the power source, the source electrode is connected to the power source and the drain electrode is connected to the P-way output port; the gate electrode of the MN1 is connected to the P-way output port, the drain electrode is connected to the N-way output port, and the source electrode is connected to the drain electrode of the MN 4; the gate electrode of the MN 2 is connected to the N-way output port, the drain electrode is connected to the P-way output port, and the source electrode is connected to the drain electrode of the MN 5; the gate electrode of the MP6 is connected to the control signal port, and the source electrode and the drain electrode are connected to the source electrodes of the MN 1 and the MN 2, respectively; the gate electrode of the MP7 is connected to the control signal port, and the source electrode and the drain electrode are connected to the N-way input port and the gate electrode of the MN 4, respectively; the gate electrode of the MP 8 is connected to the control signal port, and the source electrode and the drain electrode are connected to the P-way input port and the gate electrode of the MN 5, respectively; the MN 4 and the MN 5 are signal input pairs, the gate electrode of the MN 4 is connected to the N-way input port through the MP 7, the drain electrode is connected to the source electrode of the MN 1, and the source electrode is grounded through the MN 6; the gate electrode of the MN 5 is connected to the P-way input port through the MN 8, the drain electrode is connected to the source electrode of the MN 2, and the source electrode is grounded through the MN 6; the gate electrode of the MN 6 is connected to the control signal port, the drain electrode is connected to the source electrodes of the signal input pairs, and the source electrode is grounded. Wherein, the control signal port in the data sampling-decision-output circuit is simultaneously connected to the gate of the MP1, the gate of the MP2, the gate of the MP6, the gate of the MP7, the gate of the MP8 and the gate of the MN6 in each of the first and second sensitive amplifiers.

In conventional sensitive amplifier circuit structures, all MOS field effect transistors are included except the MP5 and the MN3. In addition to the power signal and ground signal, signal input into the P-way input port, signal input into the N-way input port, and one clock control signal. The periodic clock control signal divides the sensitive amplifier circuit into two states: a sampling state when the control signal is low and an operating state when the control signal is high. The MP 3, the MP 4, the MN 1, the MN 2 constitute a hi-stable structure; the MP 3 and the MP 4 have the same size, the MN 1 and the MN 2 have the same size, and in the normal power source supplying state, one of the N-way output port and the P-way output port must be at logic zero (ground) state and the other at a logic one (power source) state or an opposite state. The MN 4 and the MN 5 are signal input pairs having the same size, the level signal from the magnetic tunnel junction is connected to the gate electrodes of the signal input pairs as the input signal of the sensitive amplifier circuit. The MP 7 and the MP 8 are input signal switch field effect transistors, and when the control signal is low; the switch is turned on, the level signal of the magnetic tunnel junction is continuously sampled until the control signal goes high, the switch is turned off, and the voltage level of the signal input pairs always remains at the voltage value before shutdown as the input signal during operation of the sensitive amplifier circuit. The MP_1 and the MP 2 are turned on when the control signal is low, the MP 6 is turned off when the control signal is low; the effect of which is that in the sampling state, the sensitive amplifier circuit is not operating, and signal output from the P-way output port and the N-way output port are both high (power). The main purpose of turning on the MP 6 at the sampling state is to eliminate the voltage difference between the two electrodes of the MP6 caused by the difference of input signals input into the P-way and the N-way, which coupled into MP6 through parasitization, in the sampling stage.

The working principle of the original sensitive amplifier circuit is that when the control signal is low (in a sampling state), the signals from the P-way output port and the N-way output port are both high, and the P-way input port and the N-way input port are continuously sampled; when the control signal is high (in a working state), the sampling of the P-way input port and the N-way input port is closed, and the gate electrode voltage of the MN 4 and the MN 5 is the voltage value at the last moment of sampling. The MP 1, the MP 2, the MP 6, the MP 7 and MP 8 are turned off, the bi-stable structure begins to operate, one of the MN 4 and the MN 5 which has a higher gate electrode voltage will have a stronger pull-down current, the corresponding path voltage is pulled low to 0, while the other path voltage maintain the power source voltage. Therefore, the value of the P-way output port and the N-way output port can be used as a sign for judging the level of the input signal. It is noted here that the differential input signal levels must be different when the sensitive amplifier circuit is operating properly. The same level of input signal is meaningless in the sensitive amplifier circuit.

In the present disclosure, the size of the MP 3 is larger than the size of the MP 4, the size of the MN 2 is larger than the size of the MN 1, the size value of the MP 5 is the difference of the size value between MP3 and MP4, the size value of the MN 3 is the difference of the size value between the MN 2 and the MN 1. When the control signal goes high, the pull-down current capability on the P paths can be stronger than that on the N paths at the same input signal level. The redundant MP5 and MN3 are designed so that the parasitic capacitance on both sides will not vary due to the different size of MOS transistor. The size value of the MP 5 is the difference of the size value between the MP 3 and the MP 4. The size value of the MN_3 is the difference of the size value between the MN 2 and the MN 1.

The working principle of the sensitive amplifier circuit is that: when the clock signal reaches the falling edge, the MP 1, the MP 2 and the MP 6 are turned on, two differential circuits SA are charged to the power source, the sensitive amplifier circuit is restored to be in a to-be-compared state, and meanwhile, the MP 7 and the MP 8 are also turned on, so that the level signal of the MTJ is input; when the clock signal reaches the rising edge, the MP 1, the MP 2, the MP 6, the MP 7 and the MP 8 are turned off, the level signal of the magnetic tunnel junction maintains the voltage level at the clock rising edge, as the comparison signal, the sensitive amplifier circuit also enters the operating state, and the comparison result can he output before the next clock edge comes.

The operation principle of the sensitive amplifier circuit of the present disclosure is substantially identical to that of the conventional sensitive amplifier circuit, the main difference is that the same input signal level can be allowed to exist. There are two ways in the circuit that can affect the pull-down current difference between two paths. One is the difference of the input gate electrode voltages of the MN4 and the MN5, and the other is the size difference of the MN1, the MN2, and the size difference of the MP3, the MP4. The ability of the former to generate a difference in pull-down current is stronger than that of the latter. Therefore, when there is a difference in the input signal level, the working mode and the output thereof are indistinguishable from the conventional sensitive amplifier circuit; while when the levels of the input signals are the same, the pull-down current capability on the P path is stronger than that of the N path because the size is different, so the signal output from the P-way output port is low, and the signal output from the N-way output port is high.

By appropriately adjusting the width-to-length ratio value of the transistors of the differential two paths in the sensitive amplifier circuit, the influence caused by the deviation of different MTJ resistance values in the same state can also be eliminated. The principle is that, since the width-to-length ratio values are different, the current of the differential two-path of the sensitive amplifier circuit is mainly influenced by the driving capability of the MOS field effect transistor when the difference between the input voltages is small, so that the same output value can be obtained. The highest input voltage difference that leads to the same output value is referred to as the threshold voltage difference of the sensitive amplifiers. For example, when the width-to-length ratio of the transistors in the differential two paths is taken to be 6, and when the input voltage difference of the two sides is within 0.05 V, the output values are the same, which can he verificated by simulation. It can be considered that the circuit can withstand a deviation value within 0.05 v between the input values that should theoretically be the same, that is, the threshold voltage difference of the sensitive amplifiers is 0.05 v. However, the voltage deviation generated by the magnetic tunnel junction in different states is around 0.1 v, far exceeding the voltage deviation of 0.05 v, so the two sensitive amplifier circuits can output different values. Therefore, as long as a reasonable width-to-length ratio being designed, the reliability of the sensitive amplifier circuit can be significantly improved on the premise of ensuring normal operation of the sensitive amplifier circuit.

The disclosure also provides a storage state determining method for the voltage controlled magnetic anisotropic magnetic random access memory which comprises: inputting a level signal Varray generated by a selected memory cell in the memory array into the second input port in the corresponding data sampling-decision-output circuit and inputting a level signal Vref generated by a virtual cell located in the same row of the selected memory cell into the first input port in the data sampling-decision-output circuit; inputting a control signal CLK into the control signal port, and inputting the level signal generated by the virtual cell and the level signal generated by the memory cell cross into the N-way input port INN and the P-way input port INP in the first sensitive amplifier and the second sensitive amplifier, respectively; making the four output values of the corresponding N-way output ports ON1, ON2 and the P-way output ports OP1, OP2 in the first sensitive amplifier and the second sensitive amplifier logically operated in the logic circuit, and taking the output value of the output port as the storage state of the selected memory cell.

Wherein the difference between the level signals generated by the virtual cells and the memory cells in different resistance states is higher than the threshold value of the sensitive amplifiers, and the difference between the level signals generated by the virtual cells and the memory cells in the same resistance state is lower than the threshold value of the sensitive amplifiers. The threshold value of the first sensitive amplifier and the second sensitive amplifier is the maximum input voltage difference between the P-way input port and the N-way input port when the output values of the P-way output port and the N-way output port in the sensitive amplifier are the same. If the output value of the output port in the data sampling-decision-output circuit is 0, it is determined that the selected memory cell and the virtual cell are in the same resistance state, and if the output port of the output value in the data sampling-decision-output circuit is 1, then it is determined that the selected memory cell and the virtual cell are in different resistance states. At this point the logic operation is an XNOR logical operation to the output values from the P-way output ports of the two sensitive amplifiers or the output values from the N-way output ports of the two sensitive amplifiers, or the equivalent logic architecture with the same output result.

Or if the output port of the output value in the data sampling-decision-output circuit is 1, it is determined that the selected memory cell and the virtual cell are in the same resistance state, and if the output value of the output port in the data sampling-decision-output circuit is 0, then it is determined that the selected memory cell and the virtual cell are in different resistance states. At this point the logic operation is an XOR logical operation to the output values from the P-way output ports of the two sensitive amplifiers or output values from the N-way output ports of the two sensitive amplifiers, or an equivalent logic architecture with the same output result.

Finally, it should be noted that the above embodiments are only used to describe the technical solution of the present disclosure and not to restrict it. Although the present disclosure is described in detail with reference to the above embodiments, persons skilled in the art should understand that the present disclosure may be modified according to the technical solution recorded in the above embodiments or some of technical features thereof can be replaced equally; and such modifications or equivalent replacements shah not make the essence of the corresponding technical solution departing from the spirit and scope of technical solution in each embodiment of the present disclosure.

What is claimed is:

1. A voltage-controlled magnetic anisotropic magnetic random access memory, which comprises a virtual array, a memory array and a peripheral circuit;

the memory array comprises memory cells with X rows and Y columns; the virtual arrays comprises virtual cells with X rows and one column; wherein each virtual cell in the virtual array corresponds to the same row of the memory cells in the memory array;

the peripheral circuit comprises at least one data sampling-decision-output circuit, the virtual array and the memory array are simultaneously connected to the data sampling-decision-output circuit of the peripheral circuit; wherein both X and Y are integers greater than or equal to 1;

wherein the data sampling-decision-output circuit comprises a first input port, a second input port, a control signal port and an output port; wherein the first input port is connected to the virtual array, the second input port is connected to the memory array, the data sampling-decision-output circuit comprises a sensitive amplifier circuit and a logic circuit which are connected in series, the sensitive amplifier circuit comprises a first sensitive amplifier and a second sensitive amplifier with the same structure in parallel, and each of the first sensitive amplifier and the second sensitive amplifier comprises an N-way input port, a P-way input port, an N-way output port and a P-way output port; the first input port is connected to the N-way input port of the first sensitive amplifier and the P-way input port of the second sensitive amplifier, the second input port is connected to the P-way input port of the first sensitive amplifier and the N-way input port of the second sensitive amplifier, or the first input port is connected to the P-way input port of the first sensitive amplifier and the N-way input port of the second sensitive amplifier, and the second input port is connected to the N-way input port of the first sensitive amplifier and the P-way input port of the second sensitive amplifier; the N-way output port and the P-way output port in the first sensitive amplifier and the second sensitive amplifier are connected to one end of the logic circuit, and the other end of the logic circuit is connected to the output port.

2. The voltage controlled magnetically anisotropic magnetic random access memory of claim 1, wherein the first input port and the second input port in the data sampling-decision-output circuit are interchangeable.

3. The voltage controlled magnetically anisotropic magnetic random access memory of claim 1, wherein each column of memory cells in the memory array is connected to the second input port of one data sampling-decision-output circuit, or a data selector circuit, wherein one end of the data selector circuit is connected to at least one column of the memory cells, the other end is connected to the second input port in the data sampling-decision-output circuit, and the second input port of one data sampling-decision-output circuit can only selectively connect to one column of the memory cells in the memory array or the data selector circuit.

4. The voltage controlled magnetically anisotropic magnetic random access memory of claim 3, wherein the number of the data selector circuits is A and the total number of columns of memory cells in the memory array connected by the data selector circuit is B, the number of the data sampling-decision-output circuit in the peripheral circuit is (Y−B)+A, wherein, A and B are both integers greater than or equal to 0, and B is less than or equal to Y.

5. The voltage controlled magnetically anisotropic magnetic random access memory of claim 1, wherein each of the first sensitive amplifier and the second sensitive amplifier has a differential input structure.

6. The voltage-controlled magnetically anisotropic magnetic random access memory of claim 5, wherein in the first sensitive amplifier and second sensitive amplifier, gate electrodes of a first P-type field effect transistor and a second P-type field effect transistor are connected to the control signal port, source electrodes are connected to a power source, and drain electrodes are connected to the N-way output port and the P-way output port respectively; a gate electrode of a third P-type field-effect transistor is connected to the P-way output port, a source electrode is connected to the power source, a drain electrode is connected to N-way output port; a gate electrode of a fourth P-type field-effect transistor is connected to the N-way output port, a source electrode is connected to the power source and a drain electrode is connected to the P-way output port; a gate electrode of a fifth P-type field-effect transistor is connected to the power source, a source electrode is connected to the power source and a drain electrode is connected to the P-way output port; and a gate electrode of a first N-type field-effect transistor is connected to the P-way output port, a drain electrode is connected to the N-way output port, and a source electrode is connected to a drain electrode of a fourth N-type field effect transistor; a gate electrode of a second N-type field-effect transistor is connected to the N-way output port, a drain electrode is connected to the P-way output port, and a source electrode is connected to a drain electrode of a fifth N-type field-effect transistor; a gate electrode of a sixth P-type field effect transistor is connected to the control signal port, and a source electrode and a drain electrode are respectively connected to source electrodes of a first N-type field effect transistor and a second N-type field effect transistor; a gate electrode of the seventh P-type field effect transistor is connected to the control signal port, and a source electrode and a drain electrode are connected to the N-way input port and a gate electrode of a fourth N-type field effect transistor respectively; a gate electrode of an eighth P-type field effect transistor is connected to the control signal port, and a source electrode and a drain electrode are connected to the P-way input port and a gate electrode of a fifth N-type field-effect transistor respectively; and the fourth N-type field effect transistor and a fifth N-type field effect transistor are configured as signal input pairs; a gate electrode of the fourth N-type field effect transistor is connected to the N-way input port through the seventh P-type field effect transistor, a drain electrode is connected to the source electrode of the first N-type field effect transistor, a source electrode is grounded through a sixth N-type field effect transistor; a gate electrode of the fifth N-type field effect transistor is connected to the P-way input port through the eighth P-type field effect transistor, a drain electrode is connected to a source electrode of the second N-type field effect transistor, and a source electrode is grounded through the sixth N-type field effect transistor; a gate electrode of the sixth N-type field effect transistor is connected to the control signal port, a drain electrode is connected to the source electrodes of the fourth N-type field effect transistor and the fifth N-type field effect transistor, and a source electrode is grounded.

7. The voltage controlled magnetically anisotropic magnetic random access memory of claim 6, wherein the size of the third P-type field effect transistor is larger than that of the fourth P-type field effect transistor, the size of the second N-type field effect transistor is larger than that of the first N-type field effect transistor, the size of the fifth P-type field effect transistor is the difference value of the size of the third P-type field effect transistor and the size of the fourth P-type field effect transistor, and the size of the third N-type field effect transistor is the difference value of the size of the second N-type field effect transistor and the first N-type field effect transistor.

8. A storage state determining method for the voltage controlled magnetic anisotropy magnetic random access memory of claim 1, comprising inputting the level signal generated by a selected memory cell in the memory array into the second input port of the corresponding data sampling-decision-output circuit, inputting the level signal generated by the virtual cell located in the same row of the selected memory cell into the first input port of the data sampling-decision-output circuit, and inputting a control signal into the control signal port; inputting the level signal generated by the virtual cell and the level signal generated by the memory cell cross into the N-way input port and the P-way input port in the first sensitive amplifier and the second sensitive amplifier; making the four output values output by the corresponding N-way output port and the P-way output port logically operated in the logic circuit, and taking the output value of the output port as the storage state of the selected memory cell.

9. The storage state determining method of claim 8, wherein the difference value between the level signals generated by the virtual cell and the memory cell in different resistance states is higher than the threshold value of the first sensitive amplifier and the second sensitive amplifier, and the difference values between the level signals generated by the virtual cell and the memory cell in the same resistance state is lower than the threshold value of the first sensitive amplifier and the second sensitive amplifier, wherein a first signal is input to the N-way input port of the first sensitive amplifier and the P-way input port of the second sensitive amplifier; a second signal is input to the P-way input port of the first sensitive amplifier and the N-way input port of the second sensitive amplifier, and when the values output by the two P-way output ports are the same and the values output by the two N-way output ports are the same, the maximum difference between the first signal and the second signal is the threshold value of the first sensitive amplifier and the second sensitive amplifier.

10. The storage state determining method of claim 8, wherein if the output value of the output port in the data sampling-decision-output circuit is 0, it is determined that the selected memory cell and the virtual cell are in the same resistance state, and if the output value of the output port in the data sampling-decision-output circuit is 1, then it is determined that the selected memory cell and the virtual cell are in different resistance states; or if the output value of the output port in the data sampling-decision-output circuit is 1, it is determined that the selected memory cell and the virtual cell are in the same resistance state, and if the output value of the output port in the data sampling-decision-output circuit is 0, then it is determined that the selected memory cell and the virtual cell are in different resistance states.

* * * * *